(12) United States Patent
Meijer et al.

(10) Patent No.: US 7,762,186 B2
(45) Date of Patent: Jul. 27, 2010

(54) IMPRINT LITHOGRAPHY

(75) Inventors: Peter Bartus Leonard Meijer, Eindhoven (NL); Aleksey Yurievich Kolesnychenko, Helmond (NL)

(73) Assignees: ASML Netherlands B.V., Veldhoven (NL); Koninklijke Philips Electronics N.V., Eindhoven (NL)

( * ) Notice: Subject to any disclaimer, the term of this patent is extended or adjusted under 35 U.S.C. 154(b) by 1146 days.

(21) Appl. No.: 11/108,904

(22) Filed: Apr. 19, 2005

(65) Prior Publication Data

US 2006/0230959 A1    Oct. 19, 2006

(51) Int. Cl.
H01L 21/302        (2006.01)

(52) U.S. Cl. .................. 101/368; 977/887; 264/299; 101/28

(58) Field of Classification Search ........... None
See application file for complete search history.

(56) References Cited

U.S. PATENT DOCUMENTS

| | | | |
|---|---|---|---|
| 5,512,131 A | 4/1996 | Kumar et al. ............ 156/655.1 |
| 5,772,905 A | 6/1998 | Chou ..................... 216/44 |
| 6,165,911 A | 12/2000 | Calveley ................. 438/754 |
| 6,309,580 B1 * | 10/2001 | Chou ..................... 264/338 |
| 6,334,960 B1 | 1/2002 | Willson et al. ........... 216/52 |
| 6,365,059 B1 | 4/2002 | Pechenik ................. 216/52 |
| 6,375,870 B1 | 4/2002 | Visovsky et al. .......... 264/1.31 |
| 6,482,742 B1 | 11/2002 | Chou |
| 6,518,189 B1 | 2/2003 | Chou ..................... 438/706 |
| 6,656,341 B2 | 12/2003 | Petersson et al. ......... 205/667 |
| 6,696,220 B2 | 2/2004 | Bailey et al. ............ 430/272.1 |
| 6,719,915 B2 | 4/2004 | Willson et al. ........... 216/44 |
| 6,921,615 B2 | 7/2005 | Sreenivasan et al. ...... 430/22 |
| 2001/0004122 A1 * | 6/2001 | Ito ....................... 257/368 |
| 2002/0093122 A1 | 7/2002 | Choi et al. .............. 264/401 |
| 2002/0094496 A1 | 7/2002 | Choi et al. .............. 430/322 |
| 2002/0132482 A1 | 9/2002 | Chou ..................... 438/692 |
| 2002/0167117 A1 | 11/2002 | Chou ..................... 264/338 |
| 2002/0177319 A1 | 11/2002 | Chou ..................... 438/690 |

(Continued)

FOREIGN PATENT DOCUMENTS

JP    08-323817 A    12/1996

(Continued)

OTHER PUBLICATIONS

Nielsen, Theodor; "Nanoimprint lithography;" M. Sc. Thesis; Sep. 2003; Technical University of Denmark; Topology, p. 47.*

(Continued)

Primary Examiner—Daniel J Colilla
(74) Attorney, Agent, or Firm—Pillsbury Winthrop Shaw Pittman LLP

(57) ABSTRACT

An imprint template configured to imprint an imprintable medium by an imprint lithography process is disclosed, the imprint template having a pattern with a pattern density corresponding to a volume of imprintable medium used to substantially fill pattern features per unit area of a contact face of the imprint template, wherein adjacent regions of the pattern on the imprint template contact face, each of which will provide different functionality once imprinted onto a substrate, have substantially the same pattern density, have differences in pattern density which are minimized, or differences in pattern density which are maintained below a maximum.

14 Claims, 7 Drawing Sheets

U.S. PATENT DOCUMENTS

| | | | |
|---|---|---|---|
| 2003/0034329 A1 | 2/2003 | Chou | 216/44 |
| 2003/0080471 A1 | 5/2003 | Chou | 264/338 |
| 2003/0080472 A1 | 5/2003 | Chou | 264/338 |
| 2003/0081193 A1 | 5/2003 | White et al. | 355/72 |
| 2003/0127580 A1 | 7/2003 | Ling et al. | 249/115 |
| 2003/0139042 A1 | 7/2003 | Heidari | 438/689 |
| 2003/0141291 A1 | 7/2003 | Heidari et al. | 219/460.1 |
| 2003/0159608 A1 | 8/2003 | Heidari | 101/494 |
| 2003/0170053 A1 | 9/2003 | Montelius et al. | 399/318 |
| 2003/0189273 A1 | 10/2003 | Olsson | 264/293 |
| 2004/0005444 A1 | 1/2004 | Heidari | 428/212 |
| 2004/0009673 A1 | 1/2004 | Sreenivasan et al. | 438/694 |
| 2004/0021866 A1 | 2/2004 | Watts et al. | 356/401 |
| 2004/0022888 A1 | 2/2004 | Sreenivasan et al. | 425/174.4 |
| 2004/0036201 A1 | 2/2004 | Chou et al. | 264/402 |
| 2004/0046288 A1 | 3/2004 | Chou | 264/479 |
| 2004/0081798 A1 | 4/2004 | Lee et al. | 428/141 |
| 2004/0124566 A1 | 7/2004 | Sreenivasan et al. | 264/494 |
| 2004/0149367 A1 | 8/2004 | Olsson et al. | 156/64 |
| 2004/0169003 A1 | 9/2004 | Lee et al. | 216/4 |
| 2004/0192041 A1 | 9/2004 | Jeong et al. | 438/689 |
| 2004/0200411 A1 | 10/2004 | Willson et al. | 118/500 |
| 2004/0209470 A1 | 10/2004 | Bajorek | 438/689 |
| 2004/0219249 A1 | 11/2004 | Chung et al. | 425/385 |
| 2004/0219461 A1 | 11/2004 | Chung et al. | 430/311 |
| 2005/0011431 A1* | 1/2005 | Samuelson et al. | 117/40 |
| 2005/0039618 A1 | 2/2005 | Heidari et al. | 101/368 |
| 2005/0064054 A1 | 3/2005 | Kasumi | 425/112 |
| 2006/0261518 A1* | 11/2006 | Willson et al. | 264/293 |

FOREIGN PATENT DOCUMENTS

| | | |
|---|---|---|
| JP | 2000-012578 A | 1/2000 |
| JP | 2000-031180 A | 1/2000 |
| JP | 2002-096356 A | 4/2002 |
| JP | 2003-100625 A | 4/2003 |
| JP | 2003-248296 A | 9/2003 |
| JP | 2004-017322 A | 1/2004 |
| JP | 2004-221465 A | 8/2004 |
| JP | 2004-235530 A | 8/2004 |
| WO | WO 01/79591 A1 | 10/2001 |
| WO | WO 01/79592 A1 | 10/2001 |

OTHER PUBLICATIONS

Lazzarino et al.; "Mold deformation in nanoimprint lithography;" Dec. 2004; Laboratoire des Technologies de la Microelectronique; p. 3320.*

Sreenivasan et al.; "Alternative Litho Technologies: Using reverse-tone bilayer etch in ultraviolet nanoimprint lithogoraphy," Jan./Feb. 2005; MICROmagazine.com; p. 9.*

Roos et al.; "Emerging Lithographic Technologies: Nanoimprint Lithography with a Commercial 4 inch Bond System for Hot Embossing;" Aug. 2001; SPIE vol. 4343, p. 427-435.*

Tan et al.; "Current Status of Nanonex Nanoimprint Solutions;" 2004, Nanonex Corp.*

Stephen Y. Chou, et al., "Nanoimprint Lithography", J. Vac. Sci. Technol. B 14(6), Nov./Dec. 1996, pp. 4129-4133.

Notice of Reasons for Rejection for Japanese Patent Application No. 2006-114638 dated May 20, 2009.

Notice of Reasons for Rejection for Japanese Patent Application No. 2006-114638 dated Mar. 3, 2010.

* cited by examiner

IMPRINT LITHOGRAPHY

FIELD

The invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using radiation of shorter wavelength. However, there are problems associated with such reductions. Current systems are starting to adopt optical sources with wavelengths in the 193 nm regime but even at this level, diffraction limitations become a barrier. At lower wavelengths, the transparency of materials is very poor. Optical lithography machines capable of enhanced resolutions require complex optics and rare materials and are consequently very expensive.

An alternative for printing sub-100 nm features, known as imprint lithography, comprises transferring a pattern to a substrate by imprinting a pattern into an imprintable medium using a physical mould or template. The imprintable medium may be the substrate or a material coated on to a surface of the substrate. The imprintable medium may be functional or may be used as a "mask" to transfer a pattern to an underlying surface. The imprintable medium may, for instance, be provided as a resist deposited on a substrate, such as a semiconductor material, into which the pattern defined by the template is to be transferred. Imprint lithography is thus essentially a moulding process on a micrometer or nanometer scale in which the topography of a template defines the pattern created on a substrate. Patterns may be layered as with optical lithography processes so that, in principle, imprint lithography could be used for such applications as IC manufacture.

The resolution of imprint lithography is limited only by the resolution of the template fabrication process. For instance, imprint lithography may be used to produce features in the sub-50 nm range with significantly improved resolution and line edge roughness compared to that achievable with conventional optical lithography processes. In addition, imprint processes do not require expensive optics, advanced illumination sources or specialized resist materials typically required by optical lithography processes.

For the imprintable medium to flow beneath the template during the imprint process, relatively high imprint times and/or pressures may be needed. For instance, the imprintable medium may need to flow over potentially large distances depending upon the size of the template. In order to obtain a good aspect ratio between the imprinted pattern and the residual layer of imprinted medium, requiring a relatively thin residual layer, it may take minutes for the imprintable medium to move over an area corresponding to a typical die size (e.g. 1 cm$^2$). Larger template sizes may require even longer imprint times. Thus, this particular aspect of imprint lithography may represent a significant bottleneck in achieving throughput levels needed for mass produced devices, and so imprint lithography methods may not match the throughput of conventional optical lithography methods as typically used in IC production.

SUMMARY

According to an aspect of the invention, there is provided an imprint template configured to imprint an imprintable medium by an imprint lithography process, the imprint template having a pattern with a pattern density corresponding to a volume of imprintable medium used to substantially fill pattern features per unit area of a contact face of the imprint template, wherein adjacent regions of the pattern on the imprint template contact face, each of which will provide different functionality once imprinted onto a substrate, have substantially the same pattern density.

According to a further aspect of the invention, there is provided An imprint template configured to imprint an imprintable medium, by an imprint lithography process, the imprint template having a pattern with a pattern density corresponding to a volume of imprintable medium used to substantially fill pattern features per unit area of a contact face of the imprint template, wherein adjacent regions of the pattern on the imprint template contact face, each of which will provide different functionality once imprinted onto a substrate, have differences in pattern density which are minimized.

According to a another aspect of the invention, there is provided an imprint template configured to imprint an imprintable medium by an imprint lithography process, the imprint template having a pattern with a pattern density corresponding to a volume of imprintable medium used to substantially fill pattern features per unit area of a contact face of the imprint template, wherein adjacent regions of the pattern on the imprint template contact face, each of which will provide different functionality once imprinted onto a substrate, have differences in pattern density which are maintained below a maximum.

An embodiment of the invention seeks to obviate problems associated with imprinting a pattern of non-uniform pattern density by providing an imprint template which takes into account the requirements of an imprint process. That is, consideration is given to the pattern density to ensure as far as practical that the pattern has a substantially uniform pattern density. For instance, during design of a IC layout, an additional consideration may be included in the design process to ensure appropriate sizing and/or shape and/or positioning of pattern features which otherwise would not necessitate a regular arrangement (and would typically be irregular or non-uniform having regard to pattern density) to substantially reduce or eliminate variations in pattern density across the pattern, or so that differences in pattern density across the pattern are minimized or maintained below a maximum.

An embodiment of the invention may be applied to patterns which inherently have a uniform pattern density. For instance, in accordance with the an embodiment of the invention, additional 'dummy' features may be added to one or more regions of a regularly ordered pattern, to alter the pattern density of the region(s) so that it is closer to the pattern density of one or more other regions of the pattern.

According to a further aspect of the invention, there is provided an imprinting method, comprising:

contacting an imprintable medium in a flowable state on a target portion of a surface of a substrate with a template, the template defining an imprint pattern having a pattern density corresponding to a volume of imprintable medium used to substantially fill pattern features per unit area of the pattern, the pattern comprising adjacent regions, each of which will provide different functionality once imprinted onto the substrate, having substantially the same pattern density;

subjecting the imprintable medium to conditions to change the imprintable medium into a substantially non-flowable state; and separating the template from the imprintable medium while in the substantially non-flowable state.

According to another aspect of the invention, there is provided an imprinting method, comprising:

contacting an imprintable medium in a flowable state on a target portion of a surface of a substrate with a template, the template defining an imprint pattern having a pattern density corresponding to a volume of imprintable medium used to substantially fill pattern features per unit area of the pattern, the pattern comprising adjacent regions, each of which will provide different functionality once imprinted onto the substrate, having differences in pattern density which are minimized;

subjecting the imprintable medium to conditions to change the imprintable medium into a substantially non-flowable state; and separating the template from the imprintable medium while in the substantially non-flowable state.

According to another aspect of the invention, there is provided an imprinting method, comprising:

contacting an imprintable medium in a flowable state on a target portion of a surface of a substrate with a template, the template defining an imprint pattern having a pattern density corresponding to a volume of imprintable medium used to substantially fill pattern features per unit area of the pattern, the pattern comprising adjacent regions, each of which will provide different functionality once imprinted onto the substrate, having differences in pattern density which are maintained below a maximum;

subjecting the imprintable medium to conditions to change the imprintable medium into a substantially non-flowable state; and separating the template from the imprintable medium while in the substantially non-flowable state.

In an embodiment, the area of each of the regions of the pattern may be at least an order of magnitude, or at least two orders of magnitude, smaller than the area of the template contact face.

In an embodiment, the area of the regions of the pattern may be at least an order of magnitude, or at least two orders of magnitude, greater than the magnitude of the pattern features. This, for instance, may reduce the relative overhead caused by an unduly restrictive added design constraint. On the other hand, the regions should be relatively small in order to reduce the distance travelled by imprintable medium within any one region.

In some embodiments, each of the regions may have an area in the range of 0.01 $\mu m^2$ to 1 $\mu m^2$, 1 $\mu m^2$ to 10 $mm^2$, 1 $\mu m^2$ to 1 $mm^2$, 10 $\mu m^2$ to 1 $mm^2$, or 10 $nm^2$ to 1 $\mu m^2$.

The regions may be square, hexagonal, or some other equal sided shape which has internal diagonals of equal length. The regions may be regular or irregular in shape, the shape of the regions being such that the maximum flow distance of the imprintable medium within a given region is not excessively increased in comparison with a square shape having the same surface area.

Embodiments of the invention are applicable to any imprint lithography process in which a patterned template is imprinted into an imprintable medium in a flowable state, and for instance can be applied to hot and UV imprint lithography as described above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1*a* to 1*c*.

Figure 1A:
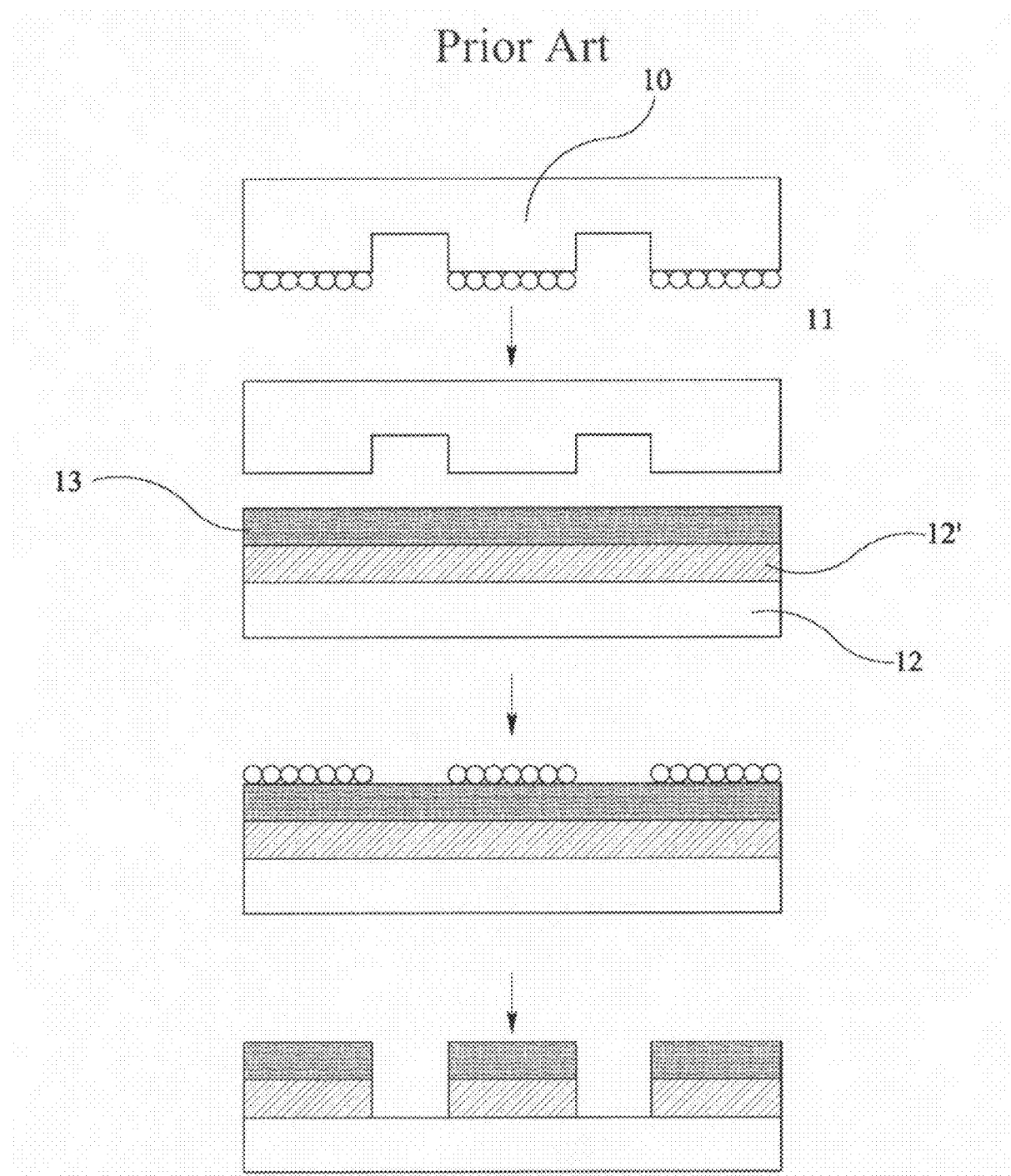
FIGS. 1*a*-1*c* illustrate examples of conventional soft, hot and UV lithography processes respectively.
Figure 1B:
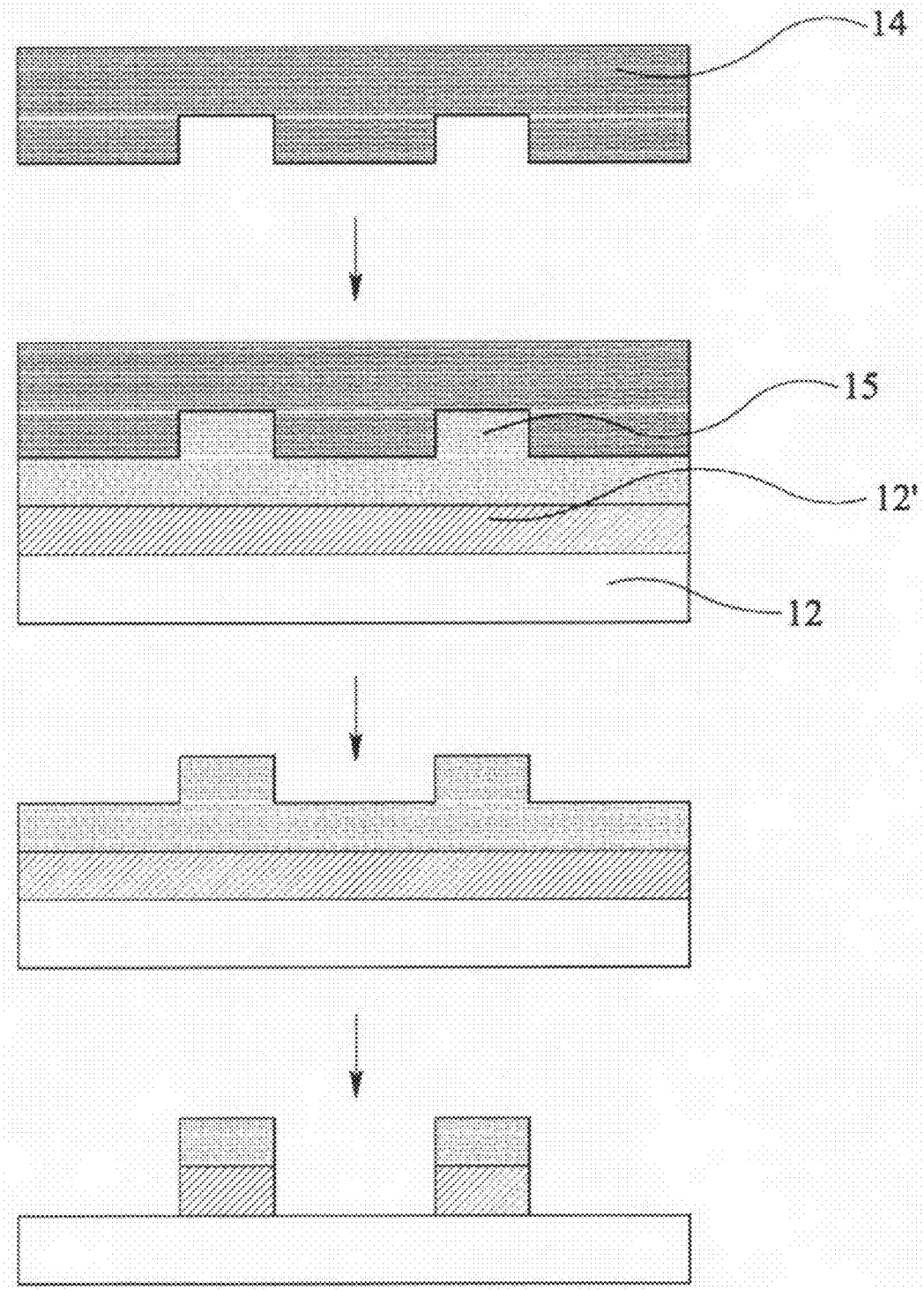
Figure 1C:
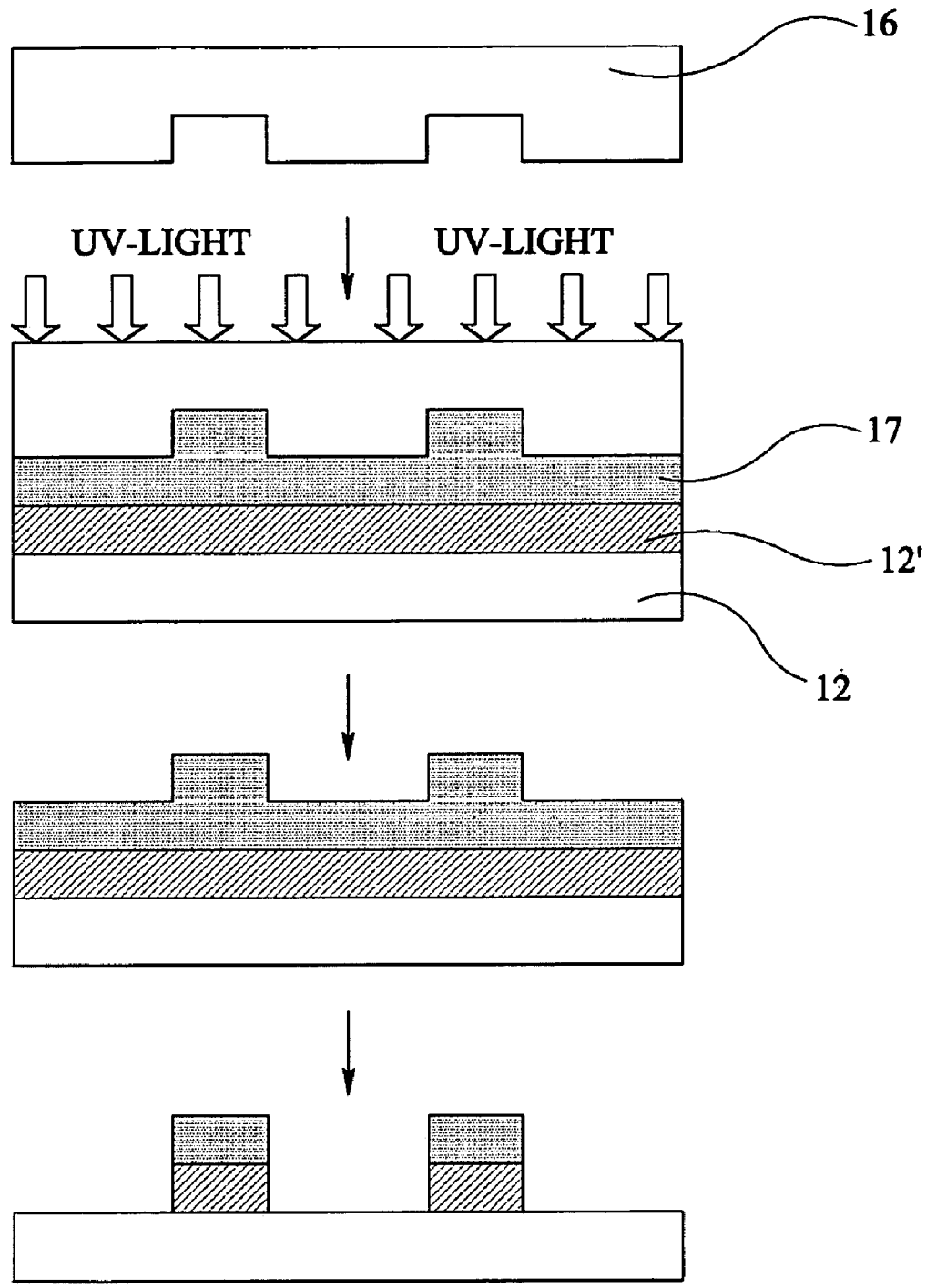

FIG. 1*a* schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1*b*. In a typical hot imprint process, a solid template 14 is imprinted into a thermosetting or a thermoplastic polymer resin 15, which has been cast on the surface of substrate. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
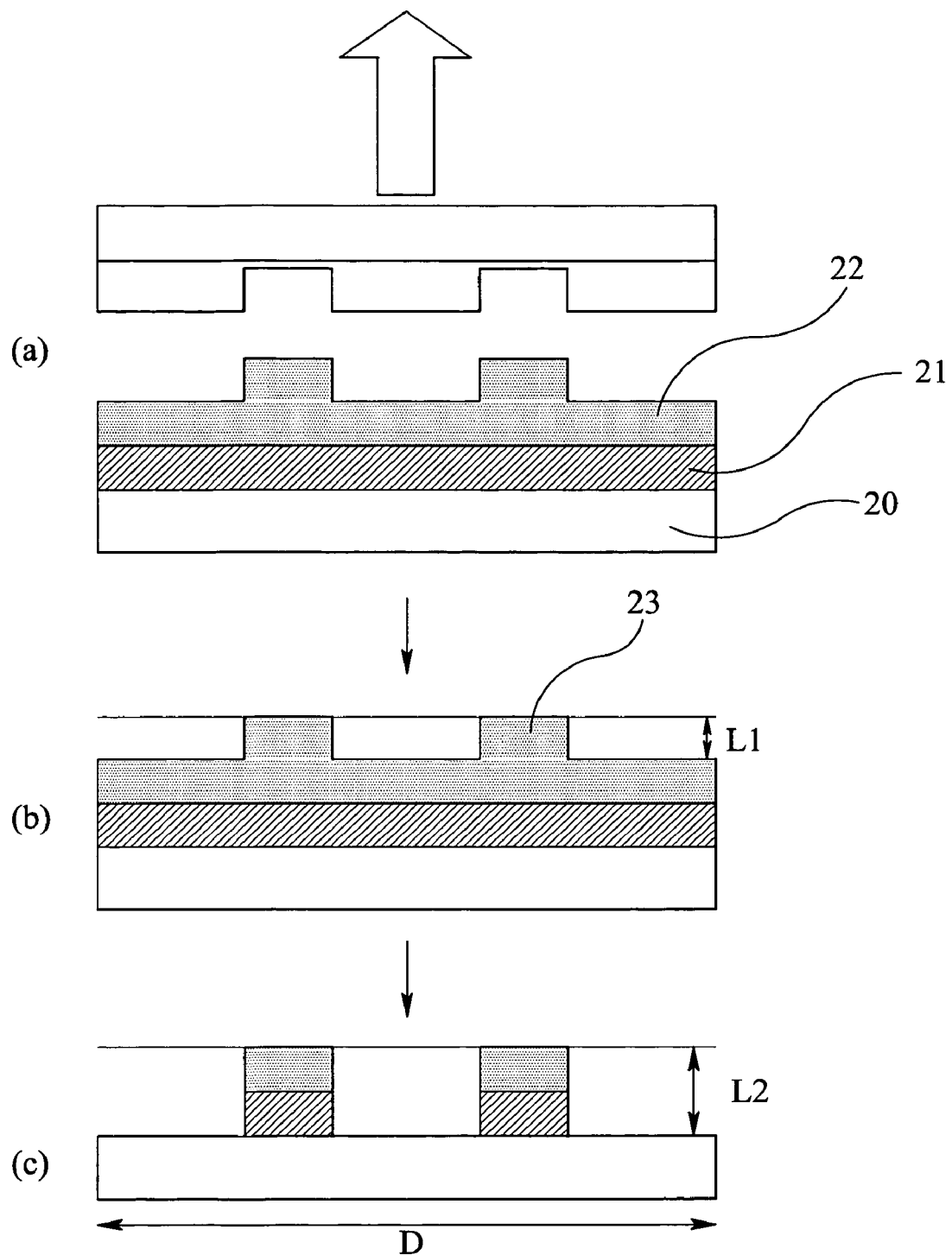
FIGS. 2*a*-2*c* illustrate a two step etching process employed when hot and UV imprint lithography is used to pattern a resist layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as described herein.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only must the pattern transfer be performed at a higher temperature, but also relatively large temperature differentials might be required in order to ensure the resin is adequately solidified before the template is removed. Temperature differentials between 35 and 100° C. may be needed. Differential thermal expansion between, for instance, the substrate and template may then lead to distortion in the transferred pattern. This may be exacerbated by the relatively high pressure needed for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically a monomer such as an acrylate or methacrylate. In general, any photopolymerizable material could be used, such as a mixture of monomers and an initiator. The curable liquid may also, for instance, include a dimethyl siloxane derivative. Such materials are less viscous than the thermosetting and thermoplastic resins used in hot imprint lithography and consequently move much faster to fill template pattern features. Low temperature and low pressure operation also favors higher throughput capabilities.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerize and thus cure it. Upon removal of the template, the remaining steps of etching the residual layer of resist are the same or similar as for the hot embossing process described herein. The UV curable resins typically used have a much lower viscosity than typical thermoplastic resins so that lower imprint pressures can be used. Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description herein, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce pattern distortions and CD variations so that SFIL may be particularly suited to manufacture of IC and other devices requiring high overlay accuracy.

Although in principle the UV curable resin can be applied to the entire substrate surface, for instance by spin coating, this may be problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a predetermined volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch the resin will have nowhere to flow.

Although reference is made herein to depositing UV curable liquids onto a substrate, the liquids could also be deposited on the template and in general the same techniques and considerations will apply.

Figure 3:
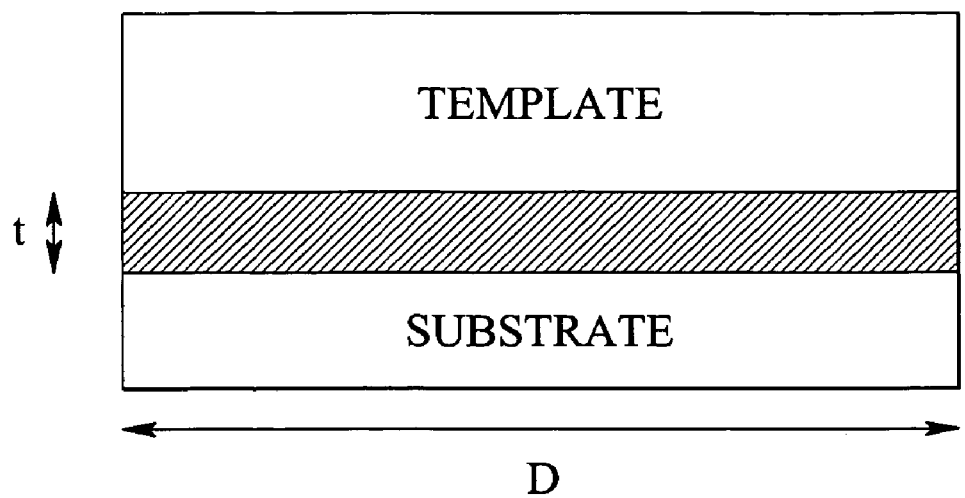
FIG. 3 schematically illustrates a template and a typical imprintable resist layer deposited on a substrate.

FIG. 3 illustrates the relative dimensions of the template, imprintable material (curable monomer, thermosetting resin, thermoplastic, etc) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned herein it may also be the source of a problem, particularly when high resolution and/or overlay accuracy is required. The first 'breakthrough' etch is isotropic (non-selective) and will thus to some extent erode the features imprinted as well as the residual layer. This may be exacerbated if the residual layer is overly thick and/or uneven. This problem may, for instance, lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process. In principle, the above problem may be reduced by ensuring the residual layer is as thin as possible but this can require application of undesirably large pressures (possibly increasing substrate deformation) and relatively long imprinting times (possibly reducing throughput).

The template is a significant component of the imprint lithography system. As noted herein, the resolution of the features on the template surface is a limiting factor on the attainable resolution of features printed on the substrate. The templates used for hot and UV lithography are generally formed in a two-stage process. Initially, the desired pattern is written using, for example, electron beam writing, to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be used as the template is effectively a 1×mask with the resolution of the transferred pattern being limited by the resolution of the pattern on the template.

The release characteristics of the template may also be a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the resist, and in the case of hot lithography, may also be subjected to extremes of pressure and temperature. This may cause wearing of the template, and may adversely affect the shape of the pattern imprinted upon the substrate.

In hot imprint lithography, there is a potential advantage in using a template of the same or similar material to the substrate to be patterned in order to reduce differential thermal expansion between the two. In UV imprint lithography, the template is at least partially transparent to the activation radiation and accordingly quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

While in the description herein, particular reference has been made to the use of imprint lithography to transfer a template pattern to a substrate via an imprintable resin effectively acting as a resist, in some circumstances the imprintable material may itself be a functional material, for instance having a functionally such as conductivity, optical linear or non-linear response, etc. For example, the functional material may form a conductive layer, a semi-conductive layer, a dielectric layer or a layer having another desirable mechanical, electrical or optical property. Some organic substances may also be appropriate functional materials. Such applications may be within the scope of the invention.

Figure 4:
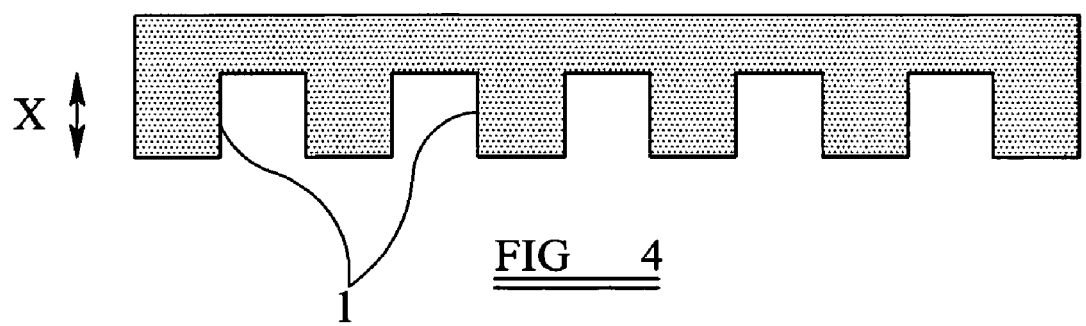
FIG. 4 is a schematic cross-section illustrating a first imprint template.

FIG. 4 is a schematic cross-sectional illustration of a simple template with a regular repeating pattern. As shown, the pattern comprises an array of features 1 (e.g. grooves or other shapes) formed (e.g. by etching) as indentations in the surface of the template, which will define relief features when the template is pressed into an imprintable medium. Each separate feature on the template has a 'fill' volume $v_{fill}$. The total fill volume $V_{fill}$ of the pattern on the template comprises the sum of the fill volumes of all of the features of the pattern.

In principle, the total amount of imprintable medium needed beneath the template illustrated in FIG. 4 to properly form the desired pattern is $V_{fill}$, plus an additional volume corresponding to a residual layer. The residual layer is a thin layer of imprintable medium which remains between a lowermost surface of the template and a substrate after the template has been applied to the substrate (the residual layer is described in more detail above). In practice, a greater volume of imprintable medium may be needed to ensure complete flow of imprintable material into the template features.

Conventional methods for depositing imprintable medium on a substrate for imprinting with a template in an imprint lithography process include methods such as spin coating a substrate surface to provide a uniform thickness layer of imprintable material, or 'drop on demand' processes in which the needed volume of imprintable medium is deposited as tiny droplets over the surface of a target portion of the substrate to be imprinted. The latter process is typically used in a 'step and repeat process' where only relatively small portions of a substrate surface are imprinted in each imprinting step. Spin coating and similar processes are more suited to covering the entire surface of a substrate which is to be imprinted in a single imprint step. In either case, the volume of imprintable medium needed can be determined having regard to the total fill volume $V_{fill}$ of the pattern on the template as a whole.

For the purposes of the description herein, it is useful to refer to the 'density' of the pattern features defined by the template. The 'pattern density' corresponds to the volume of imprintable medium used to substantially fill the pattern features per unit area of the template contact face. For ease of description, for a template having a given pattern feature depth, the pattern density can be normalized to have a value between 0 and 1, where 0 indicates that the template comprises a single pattern feature which covers the entire template, and 1 indicates that the template has no pattern features. A pattern density may be determined for an entire template, or the template may be considered as an array of adjoining regions, a pattern density being determined for each region.

Figure 5:
FIG. 5 is a schematic cross-section illustrating a second imprint template.
Figure 6:
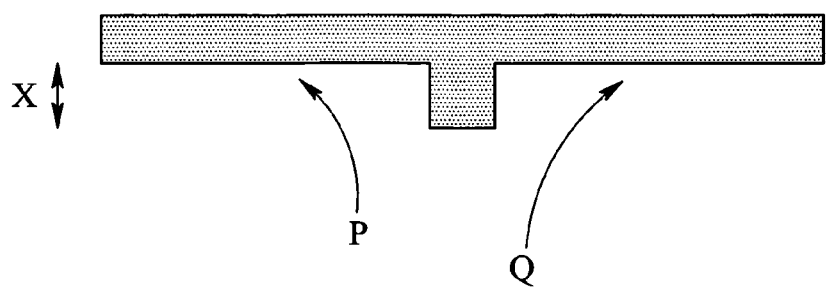
FIG. 6 is a schematic cross-section illustrating a third imprint template.

The pattern density of the template of FIG. 4 is for instance approximately 0.5, indicating that half of the template would be filled with imprintable medium. Consider, however, a template as illustrated in FIG. 5. This has a single feature of fill volume $v_{fill}$ so that the total fill volume of the template as a whole $V_{fill}=v_{fill}$. This template pattern has a pattern density close to 0. In contrast, FIG. 6 shows a simple template defining two large features. The template has a large total fill volume $V_{fill}$ and a pattern density approaching 1.

In each case illustrated in FIGS. 4 to 6, the volume of imprintable medium needed to correctly form the features can be calculated. For example, a much smaller volume of material is needed for the template shown in FIG. 5 than for the template shown in FIG. 6. The amount of imprintable material applied to the substrate prior to imprinting is controlled accordingly. A problem arises when different regions of the template require different volumes of imprintable material to form features (i.e. the different regions of the template have different pattern densities). This is because for a given uniform layer of imprintable medium, there may be mismatches between the locally needed volumes of imprintable medium in different regions of the template. This means that the imprintable medium has to flow over relatively large distances from one region to another (e.g. from a high pattern density region to a low pattern density region) in order to substantially fill all of the pattern features. The time needed for the imprintable medium to flow over the relatively large distances may be considerably longer than would otherwise be needed. This can reduce the productivity of the imprint process. Indeed, this may be a significant disadvantage because the number of substrates (or the amount of substrate surface area) that can be processed per hour is an important performance parameter of lithography machines. An associated problem which arises when different regions of the template need different volumes of imprintable material, is that substantial pressures may be generated, which may cause distortion of the template or the substrate. This may in turn damage the resulting imprinted pattern.

Figure 7:
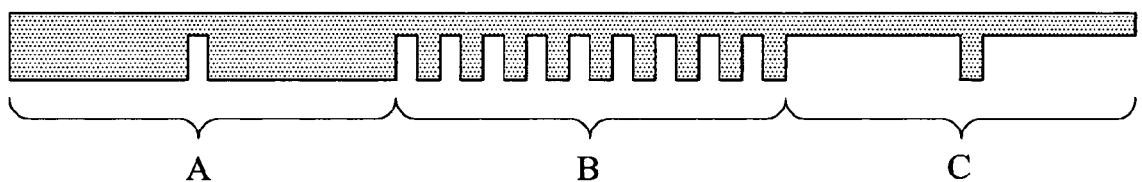
FIG. 7 is a schematic cross-section illustrating a fourth imprint template.
Figure 8:
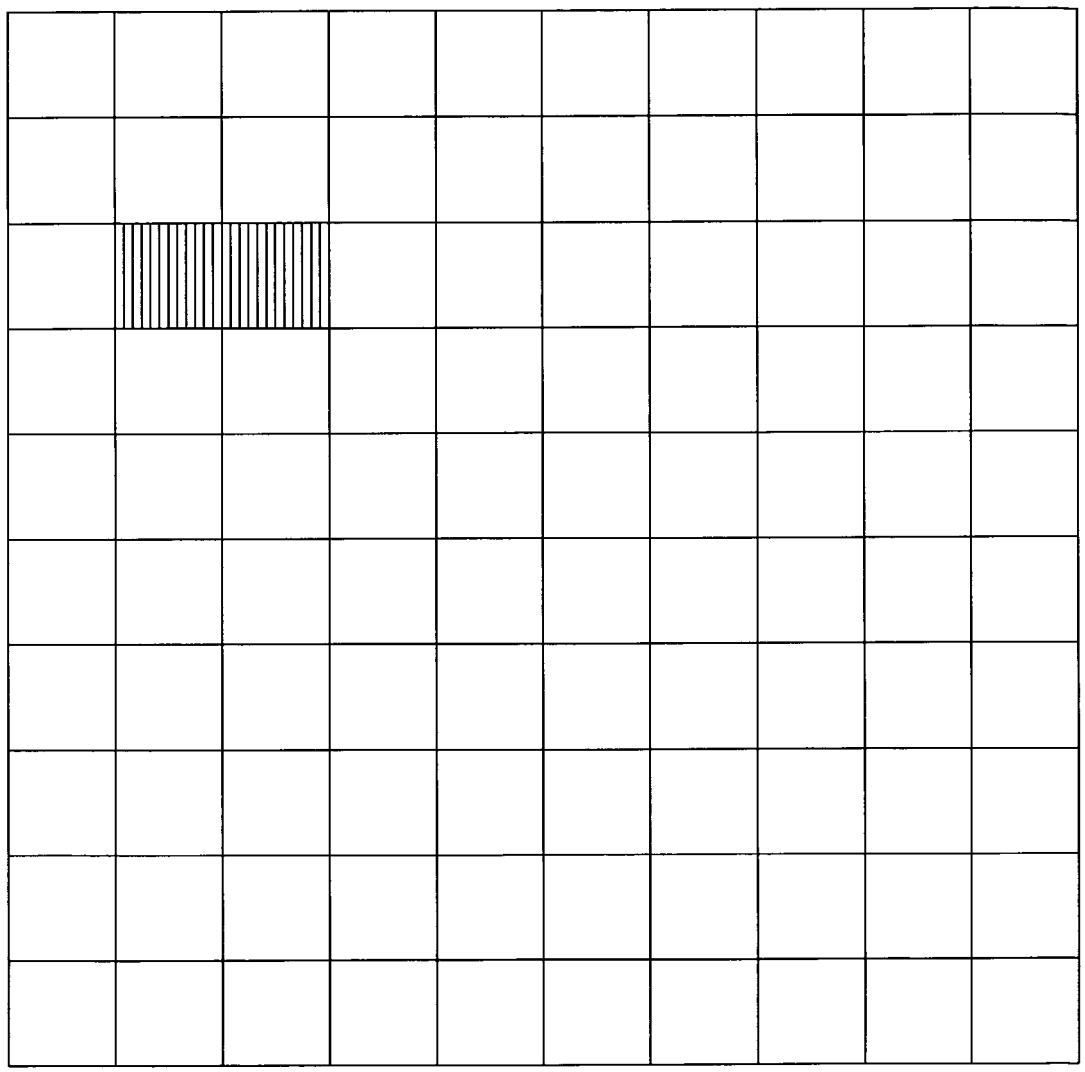
FIG. 8 illustrates an example of a pattern having regions according to one aspect of the invention.

FIG. 7 illustrates a template which may suffer from the above problem. The template can be regarded as having three different pattern regions, A, B and C, each of which has a uniform pattern density considered alone, but with significant differences in pattern density between each of the regions. The imprintable medium onto which the template will be applied will have a constant thickness. Thus, in order to properly fill the pattern on the template, with an acceptably thin residual layer remaining under the template, a substantial amount of imprintable medium must flow from region A to region B, and from region B to region C. This may have a significantly adverse effect on the imprint times and forming the complete pattern in the imprintable medium, and may cause unwanted pressures to arise in the medium.

For templates provided to imprint ultra-regular structures, such as typically envisaged for nanoscale cross-bar networks, the pattern density will be substantially uniform across the template surface, and the above described problem may not arise. However, there are many other patterns which may be imprinted that may have an essentially random layout and accordingly an irregular or non-uniform pattern density (the term 'essentially random' is intended to mean that the pattern is predominantly irregular, and is not intended to imply that the pattern is fully random in a mathematical sense).

For instance, many IC layouts produced in accordance with conventional design-to-layout mappings have different regions which provide different functionality, and these regions tend to be essentially random as far as pattern density is concerned. The term 'functionality' is not intended to be limited to operational characteristics of fabricated ICs, and may also include other functionality, for example alignment marks located between adjacent ICs (more than one IC may be fabricated by a single imprint template).

In accordance with an aspect of the invention, the pattern on the imprint template is designed such that regions which will have different functionality once imprinted onto a substrate, have differences in pattern density which are reduced or minimized. This is achieved by modifying the pattern design process (be it an IC layout mapping or any other design to be replicated as a pattern defined by an imprint template for transfer to an imprintable medium) to include a step of defining the size and/or shape and/or position of pattern features which do not otherwise necessitate a regular arrangement, so that variations in pattern density over a pattern to be defined by an imprint template are reduced or minimized. This should reduce the distance imprintable medium flows beneath the template, and hence reduce imprint times. One example of a way that this could be done is to change the location of some pattern features, for example shifting some devices of an electronic circuit design. In an embodiment, the result is a template pattern with a substantially uniform pattern density. The pattern to be defined by a single template could, for instance, be nominally divided into a plurality of regions each arranged to have substantially the same pattern density thereby reducing or minimizing the amount of medium that flows from one region to the next. In other words, this reduces or minimizes the total distance over which imprintable medium flows. For example, the pattern density may be substantially uniform on a micrometer scale, for instance adjacent template regions of the order of 1-100 $\mu m^2$ may have substantially the same pattern density, thereby having substantially the same $V_{fill}$ requirement when the template is imprinted in an imprintable medium.

The pattern density may not be strictly uniform when considered on a very small (e.g. nanometer) scale, but should be, in an embodiment, uniform when considered on a scale an order of magnitude or more greater than the scale of the pattern features. For example, the pattern density may be arranged such that it has a uniform density when considered on a micrometer scale, where the pattern features are on a nanometer scale. For instance, during the pattern design process, the pattern to be designed on a single template can be effectively subdivided into an array of adjacent regions, and the design process modified so that the pattern density of each region is substantially the same. The result could be significantly reduced flow of imprintable medium beneath the template from one region to the next. For example, for a pattern to be defined by a template of an area of more than 1 cm² it may be appropriate to define pattern regions of the order of 1-100 µm² (assuming nanoscale pattern features) which each have substantially the same pattern density. More generally, it may be appropriate to define pattern regions of an area at least an order of magnitude greater than the scale of the pattern features, and, in an embodiment, at least an order of magnitude smaller than the area of the pattern to be defined by a single template. For example, for a 1 cm² template pattern, regions defined at about 10 µm² may be sufficient to give significant benefits (e.g. to significantly reduce the time needed for imprintable medium flow). Where, for example, features with dimensions as small as 1 nm² are formed, it may be useful to define regions at about 10 nm², or some other suitable larger value.

As a general rule, the regions should be as small as possible. This is so that the effect of any density variation within a given region is reduced or minimized. This can be best understood by considering a region which has a certain pattern density when considered as a whole, but which includes an area of high density and an area of low density. During imprint, the imprintable medium flows from the high density area to the low density area. This will occur slowly if the region has a large size, but will occur more quickly if the region has a small size. A restriction which prevents the size of the region from becoming very small, is the desire that sufficient space be available to allow modifications of the pattern to adjust the pattern density. For example, if the size of the region is too small, there may be no suitable space available into which dummy features (discussed in more detail below) may be introduced to increase the density of the pattern.

In some instances, it may not be possible to obtain a template in which the pattern density of adjacent regions is substantially the same. Where this is the case, an embodiment of the invention may be used to reduce differences in pattern density between adjacent regions to a minimized value, or to be below a maximum value. 'Drop on demand' depositing of imprintable medium may be used to selectively deposit different amounts of imprintable material onto the adjacent regions, thereby reducing the negative effect of the remaining differences in pattern density.

As mentioned above, some device layouts may have a very regular pattern which covers the entire device. The entire surface of a template for such a device will have the same pattern density, and thus an embodiment of the invention may not be needed. Embodiments of the invention would typically be directed to patterns which would not otherwise be regular and thus would lead to an imprint template of non-uniform pattern density without application of an embodiment of the invention.

A pattern region may comprise areas having regularly ordered features and areas having irregular or non-uniform features. The regular areas may be modified so that the pattern density of the regular areas substantially corresponds to that of the irregular or non-uniform areas. Similarly, the irregular or non-uniform areas may be modified to provide a pattern density which substantially corresponds to that of regular areas. The choice of whether to modify the regular areas or the irregular (or non-uniform) areas may be based upon which causes the least impact on the working properties of the pattern in the pattern region.

An embodiment of the invention may also be applied in some cases to pattern regions comprising substantially of regularly ordered features. For instance, different regions of the pattern may have different arrays of features, each of which is regularly ordered but has a different pattern density. Where this is the case, an embodiment of the invention could be applied by modifying the pattern of one or more regions, to reduce the pattern density difference between regions.

Modifying the pattern may comprise reconfiguring functional pattern features. In addition or alternatively, 'dummy' features may be provided expressly for adjusting the pattern density. For instance, rather than reconfiguring functional pattern features, it may be necessary, or simpler, to introduce non-functional features into some regions of the pattern to adjust the pattern density as designed.

The addition of such 'dummy' or non-functional pattern features (that is non-functional with regard to the ultimate imprinted pattern function) may also be used to increase the pattern density above a minimum. For instance, there may be a pattern area which has a regularly ordered pattern of low pattern density located next to a pattern area which has a regularly ordered pattern of medium pattern density. Appropriate dummy features may be added to the low density pattern area, thereby increasing the overall pattern density of that area while keeping the pattern uniform.

Dummy pattern features may be used to increase pattern density or to decrease pattern density. For example, additional dummy indentations may be provided in a template to increase the pattern density in a region which has a low pattern density. Conversely, a large indentation in a template may be partially filled with dummy structures in order to reduce the pattern density.

By providing a template with regions each having substantially the same pattern densities, or put another way a pattern fill volume which is conserved on a relatively small scale compared to the size of the template, problems associated with templates defining patterns of a non-uniform pattern density may be obviated. Imprintable medium may thus be disposed on a substrate in accordance with known techniques providing a substantially uniform volume distribution over an area of the substrate to be imprinted.

Thus, when imprinting with a template pattern designed in accordance with an embodiment of the invention, it may be only necessary to consider the total volume requirement of the imprintable medium for imprinting, for practically any combination of any type of pattern features blocks or modules. As mentioned above, it is relatively straightforward to determine an optimum total volume requirement, considering the template as a whole so that the imprintable medium is largely confined to the area to be imprinted while ensuring good definition in the imprinted features. This could lead to significantly increased throughput capability and/or optimal imprint pressures as well as reducing loss of imprintable medium beyond the area being imprinted (and possibly a subsequent loss of substrate surface).

As indicated above, it is not necessary for adjacent regions of the template pattern of a particular size to have an identical fill volume or pattern density. For instance, if the pattern density is substantially constant when considered over a plurality of neighboring regions of the template pattern, there will be greatly reduced probability that the imprintable medium will need to flow beyond a small number of such defined regions. Similarly, an embodiment of the invention may be applied to minimize differences in pattern density between neighboring regions, or maintain any such differences below a maximum.

In accordance with an embodiment, there is no need to modify an otherwise conventional imprint lithography process. In other words, problems associated with appropriate distribution of imprintable medium are addressed at the pattern design stage rather than during the imprint process itself. Thus, there is no requirement for a modified imprint process or apparatus.

While an embodiment of the invention introduces an additional constraint or consideration into the pattern design process than may be otherwise conventional, it is expected that this can be readily accommodated in many practical applications. For instance, certain pattern features can be repositioned or resized without affecting the overall functionality or 'efficiency' of the pattern design. For example, areas used for local decoupling capacitances in IC design layouts may be partially patterned to 'tune' the localized fill volume of the pattern to achieve the desired pattern density across the pattern as a whole.

The shape of the regions for which the pattern density is adjusted may have an impact on the benefits provided by an embodiment of the invention. For example, square shaped regions may be more beneficial than long narrow rectangular shaped regions. This is because the maximum flow distance of imprintable medium within a long narrow rectangular region will be much longer, and hence the flow of the medium should be much slower. As a general rule, a square, hexagon, or other equal sided shape which has internal diagonals of equal length is preferred. A rectangle may be used, provided that the ratio of length of its long sides and its short sides is sufficiently low that the maximum flow distance of the imprintable medium within the region is not excessively increased in comparison with a square shape having the same surface area. This principle, that the maximum flow distance of the imprintable medium within the region is not excessively increased in comparison with a square shape having the same surface area, may be applied to shapes other than a rectangle, for example a parallelogram or even an irregular shape. Other suitable shapes will be apparent to those skilled in the art. The term 'not excessively increased' is intended to mean that the maximum flow distance is not increased to the extent that the benefits of the invention are lost.

In the description herein, the term pattern density is intended to mean the volume of imprintable medium used to substantially fill the pattern features per unit area of the template contact face. For a template in which all pattern features have the same depth, the pattern density is linearly related to the proportion of surface area of a template region which is covered by the pattern. In some instances it may be the case that the pattern has pattern features having more than one depth (so called 'multi-tier' patterns). Where this occurs, the pattern density is no longer linearly related to the proportion of template surface area covered by the pattern. For example, the pattern density could be raised by increasing the depth of some pattern features, without altering the amount of template surface area covered by the pattern. It is the pattern density that should be used when implementing an embodiment of the invention (i.e. the volume of imprintable medium needed to fill the pattern features per unit area of the contact face) and not the proportion of template surface area covered by the pattern.

The embodiments of the invention are not limited to any particular pattern design process, or any particular type of device to be fabricated by the imprint process. In other words, the embodiments may be applied to any pattern that is to be transferred via an imprint template except possibly those patterns that inherently require a regular repeating structure which cannot be modified but which in any event have a uniform pattern density (considered at template or region to region scale).

In an embodiment, it may be useful to provide the template with formations adjacent its edges which provide a "sink" or "drain" for excess imprintable medium which might otherwise flow beyond the template and the target portion of the substrate to be printed. Imprintable medium which spreads out beyond the template may lead to loss of available substrate area for further imprinting. For instance, in current IC manufacturing processes, the space left between two ICs which may be printed next to each other on a common substrate is typically approximately 40 μm. If the substrate area, beyond a template configured to imprint a pattern layer of such an IC, taken by excess imprintable medium is greater than this, the number of ICs that may be included on a single substrate could be reduced with a corresponding increase in manufacturing cost.

The formation for receiving, and possibly storing, the excess imprintable medium may be provided as a channel around the edge of the contact face of the template, having a lateral opening at the level of the contact face to receive any excess material flowing beyond the contact face. In an embodiment, the channel has an opening dimension lateral to the contact face that is greater than the spacing of the contact face and substrate to ensure that there is a relatively small flow resistance to material flowing into the channel. For instance, a lateral dimension of the order of ten or one hundred microns may be appropriate where the contact face of the template is spaced from the substrate by a distance of the order of 100 nm. In an embodiment, the channel may be open at an end opposite the substrate level opening to allow excess material to be drawn off. It will be appreciated that the "sink" or "drain" could have a variety of different configurations, such as a chamber, and may be applied to templates other than the template embodiments described above.

While specific examples of the invention have been described above, it will appreciated that the invention may be practiced otherwise than as described. The description is not intended to limit the invention.

The invention claimed is:

1. An imprint template configured to imprint an imprintable medium by an imprint lithography process, the imprint template having a pattern with a pattern density, the pattern density being a parameter defined as a volume per a unit area, wherein the area corresponds to an area of a contact face of the imprint template and wherein the volume corresponds to a volume of imprintable medium used to substantially fill pattern features of the contact face, wherein adjacent regions of the pattern on the imprint template contact face, each of which has a different pattern arrangement, have substantially the same pattern density.

2. The imprint template according to claim 1, wherein the pattern includes a pattern feature included primarily for its effect on the pattern density in the region of the feature.

3. The imprint template according to claim 2, wherein the pattern feature is non-functional when imprinted onto the substrate.

4. The imprint template according to claim 1, wherein an area of each of the regions of the pattern is at least an order of a magnitude smaller than the area of the template contact face.

5. The imprint template according to claim 1, wherein an area of each of the regions of the pattern is at least two orders of a magnitude smaller than the area of the template contact face.

6. The imprint template according to claim 1, wherein an area of the regions of the pattern is at least an order of magnitude greater than a magnitude of the pattern features.

7. The imprint template according to claim 1, wherein an area of the regions of the pattern is at least two orders of magnitude greater than a magnitude of the pattern features.

8. The imprint template according to claim 1, wherein each of the regions has an area in the range of 0.01 $\mu m^2$ to 10 $mm^2$.

9. The imprint template according to claim 1, wherein each of the regions has an area in the range of 0.01 $\mu m^2$ to 1 $mm^2$.

10. The imprint template according to claim 1, wherein each of the regions has an area in the range of 0.01 $\mu m^2$ to 1 $\mu m^2$.

11. The imprint template according to claim 1, wherein each of the regions has an area in the range of 10 $\mu m^2$ to 1 $mm^2$.

12. The imprint template according to claim 1, wherein each of the regions has an area in the range of 10 $nm^2$ to 1 $\mu m^2$.

13. The imprint template according to claim 1, wherein the regions are square, hexagonal, or some other equal sided shape which has internal diagonals of equal length.

14. The imprint template according to claim 1, wherein a shape of the regions is such that a maximum flow distance of the imprintable medium within a given region with a surface area is not excessively increased in comparison with a maximum flow distance in a region comprising a square shape having the same surface area.

* * * * *